United States Patent [19]
Kai et al.

[11] Patent Number: 5,180,920
[45] Date of Patent: Jan. 19, 1993

[54] METHOD AND APPARATUS FOR MAKING CHARGED PARTICLE BEAM EXPOSURE

[75] Inventors: Junichi Kai; Hiroshi Yasuda; Yoshio Watanabe, all of Kawasaki, Japan

[73] Assignee: Fujitsu Limited, Kawasaki, Japan

[21] Appl. No.: 854,086

[22] Filed: Mar. 19, 1992

[30] Foreign Application Priority Data

Mar. 20, 1991 [JP] Japan .................................. 3-57469

[51] Int. Cl.[5] .......................................... H01J 37/302
[52] U.S. Cl. .................................. 250/492.2; 250/398
[58] Field of Search ................. 250/492.2, 492.22, 398

[56] References Cited

FOREIGN PATENT DOCUMENTS

| | | |
|---|---|---|
| 59374 | 5/1978 | Japan . |
| 277724 | 12/1987 | Japan . |
| 241121 | 9/1989 | Japan . |
| 241122 | 9/1989 | Japan . |
| 248618 | 10/1989 | Japan . |
| 2609 | 1/1990 | Japan . |
| 183516 | 7/1990 | Japan . |

Primary Examiner—Jack I. Berman
Attorney, Agent, or Firm—Staas & Halsey

[57] ABSTRACT

A charged particle beam exposure method is used to expose an exposure region of a substrate which is placed on a movable stage by irradiating a charged particle beam on the exposure region of the substrate. The method includes the steps of (a) dividing the exposure region into a plurality of band-shaped regions, (b) deflecting the charged particle beam within a drawing range from one side to the other side of each band-shaped region in a longitudinal direction of the band-shaped region while continuously moving the stage in a stage moving direction, where the drawing range is a range in which the charged particle beam can be deflected, (c) monitoring a deflection position of the charged particle beam on the substrate along the stage moving direction, and (d) varying a moving speed of the stage depending on the deflection position relative to one or a plurality of reference positions located along the stage moving direction within the drawing range.

20 Claims, 14 Drawing Sheets

METHOD AND APPARATUS FOR MAKING CHARGED PARTICLE BEAM EXPOSURE

BACKGROUND OF THE INVENTION

The present invention generally relates to charged particle beam exposure methods and apparatuses, and more particularly to a charged particle beam exposure method for making a charged particle beam exposure at a high speed and with a high accuracy and to a charged particle beam exposure apparatus which employs such a charged particle beam exposure method.

Recently, further improvements have been made with regard to the integration density and functions of integrated circuits (ICs). Hence, it is anticipated that these ICs will enhance technical progress in the industry in general, such as in computers, communication equipments and control systems for machines. The integration density of the ICs has increased by approximately four times in the recent two or three years. In the case of a dynamic random access memory (DRAM), for example, the integration density has improved considerably and the memory capacity has increased from 1 Mbit to 4 Mbit, 16 Mbit, 64 Mbit, 256 Mbit, and to even 1 Gbit. Such improvements in the integration density is due to the progresses made in forming fine patterns, and the optical technique has improved to such an extent that it is now possible to form a fine pattern having a length of 0.5 $\mu$m, for example.

However, the limit of forming the fine pattern by the optical technique is about 0.4 $\mu$m in length. Particularly, it is becoming extremely difficult to form a contact hole, to make a position alignment to an underlying layer and the like with an accuracy which will result in an error of 0.15 $\mu$m or less.

On the other hand, charged particle beam exposures typified by an electron beam exposure are anticipated as techniques capable of overcoming the difficulties encountered in the optical technique. In addition, it is anticipated that the charged particle beam exposure can form patterns and make position alignments with an accuracy which will result in an error of less than 0.15 $\mu$m at a high speed and with a high reliability.

A description will be given of a charged particle beam exposure method, by referring to FIG. 1. FIG. 1 shows a plan view of a sample which is exposed by a charged particle beam, and a plurality of chips 10 are arranged on a wafer or a glass substrate. Each chip 10 is a collection of a plurality of square cells 11 having a side of approximately 2 mm. The wafer and thus the chips 10 arranged thereon are placed on a predetermined stage (not shown) at the time of the exposure and is moved in a stage moving direction indicated by an arrow. The cells 11 which are arranged in one row along the stage moving direction form a frame 12, and each frame 12 is exposed while continuously moving the stage. Each cell 11 is formed by a square sub field 13 having a side of approximately 100 $\mu$m, and a plurality of sub fields 13 arranged in a band region along a direction perpendicular to the stage moving direction as indicated by a hatching form a band 14.

The conventional charged particle beam exposure method is carried out as follows with respect to the sample described above. If the electron beam is used as the charged particle beam, the exposure is made in frames 12 in which the cells 11 are arranged along the stage moving direction. In each frame 12, each cell 11 is taken as one exposure range, and the exposure process is carried out for each band within the cell 11. In other words, by use of a main deflector which covers the entire region of the cell 11 having the side of approximately 2 mm, the electron beam is deflected in the direction perpendicular to the stage moving direction for each band 14. Hence, the electron beam is deflected to a center position of each sub field 13. For example, the main deflector is made of an electromagnetic deflector having a deflection range of $\pm 1000$ $\mu$m. While making the above described deflection by the main deflector, a sub deflector deflects the electron beam in a fine range within the sub field 13. For example, the sub deflector is made of an electrostatic deflector having a deflection range of $\pm 50$ $\mu$m. In addition, a shot 15 is formed by varying the electron beam size to a desired shot size by a slit deflector, and the pattern exposure is made by forming a pattern 16 which is a collection of shots 15. For example, the slit deflector is made of an electrostatic deflector having a maximum size varying range of 3 $\mu$m. If the stage moves a distance equal to the width (100 $\mu$m) of the band 14 during the time in which all of the patterns 16 within one band 14 can be exposed, it becomes possible to synchronize the stage movement and the exposure time and the exposure process can be carried out efficiently.

However, the density of the patterns 16 of the IC are non-uniform in general, and the exposure times of the bands 14 are not constant. If the moving speed of the stage is too fast, the stage moves past the drawing range of the main deflector and the so-called main deflector overflow occurs. In this case, some parts of the patterns 16 cannot be exposed, and the patterns cannot be exposed in a correct manner. On the other hand, if the moving speed of the stage is too slow, it takes considerable time to complete the exposure and the throughput deteriorates.

Accordingly, the exposure must be carried out at an appropriate moving speed of the stage, and the determination of the stage moving speed is an important factor.

FIG. 2 shows an example of a conventional stage controller. The stage is controlled to move in an orthogonal X-Y coordinate system, and for example, a position coordinate (X-LASER, Y-LASER) is measured by a laser interferometer or the like. The position coordinate (X-LASER, Y-LASER) is input to a digital signal processor (DSP) 20 which functions as a speed controller. The DSP 20 corrects moving speed instructions Vx and Vy for the X and Y axis with respect to set values X and Y using the position coordinate (X-LASER, Y-LASER). The corrected moving speed instruction for the X-axis is supplied to a motor 23x which drives the stage along the X-axis, via a digital-to-analog converter (DAC) 21x and an amplifier 22x. On the other hand, the corrected moving speed instruction for the Y-axis is supplied to a motor 23y which drives the stage along the Y-axis, via a DAC 21y and an amplifier 22y.

Next, a description will be given of the method of obtaining the stage moving speed in the DSP 20. In order to determine the stage moving speed, the exposure time for each band 14 is first calculated based on the number of shots 15 and the number of patterns 16 for each sub field 13. Then, the stage moving speed is set according to one of the following methods.

According to a first method, the stage moving speed is set according to a maximum exposure time out of the exposure times of each of the bands 14, and the stage is moved at the set stage moving speed which is sufficient to expose the band 14 which takes the maximum exposure time. As a result, although there is a slight waste of time during the exposure of the cell 11, the main deflection overflow is positively prevented.

According to a second method, an average stage moving speed is obtained for the bands 14 within the cell 11, and the stage moving speed is checked again for each band 14. If the exposure cannot be finished within the drawing range at the average stage moving speed, the stage moving speed is adjusted, that is, reduced in this case. In other words, the average stage moving speed is determined from the exposure times of each of the bands 14 within the cell 11, and the stage moving speed is adjusted with reference to the average stage moving speed so that all of the bands 14 can be exposed within the drawing range of ±1000 μm, for example.

The stage moving speed may be obtained for each cell 11, and a common stage moving speed within the frame may be obtained from the stage moving speeds obtained for each of the cells 11.

However, the conventional charged particle beam exposure method suffer from the following problems when determining the stage moving speed.

First, it is necessary to know the number of bands, the number of sub fields 13, the number of patterns 16 and the number of shots 15, because the stage moving speed is calculated from these numbers. As a result, a long processing time is required to calculate the stage moving speed.

Second, an exposure current which is set when the stage moving speed is calculated may be different from an exposure current which is required to actually move the stage at the calculated stage moving speed. In this case, the stage cannot follow the change in the exposure current. In addition, the stage cannot follow a change in a parameter during the exposure.

Third, if the density of the patterns 16 greatly differs depending on the region within the sub field 13, the stage moving speed must be changed at a large number of points and the stage moving speed undergoes repeated changes. Therefore, complex calculations must be made and the processing time becomes long if the stage moving speed is to undergo gradual changes.

SUMMARY OF THE INVENTION

Accordingly, it is a general object of the present invention to provide a novel and useful charged particle beam exposure method and apparatus in which the problems described above are eliminated.

Another and more specific object of the present invention is to provide a charged particle beam exposure method for exposing an exposure region of a substrate which is placed on a movable stage by irradiating a charged particle beam on the exposure region of the substrate, comprising the steps of (a) dividing the exposure region into a plurality of band-shaped regions, (b) deflecting the charged particle beam within a drawing range from one side to the other side of each band-shaped region in a longitudinal direction of the band-shaped region while continuously moving the stage in a stage moving direction, where the drawing range is a range in which the charged particle beam can be deflected, (c) monitoring a deflection position of the charged particle beam on the substrate along the stage moving direction, and (d) varying a moving speed of the stage depending on the deflection position relative to one or a plurality of reference positions located along the stage moving direction within the drawing range. According to the charged particle beam exposure method of the present invention, it is possible to always move the stage at an optimum speed so that the charged particle beam exposure can be carried out at a high speed.

Still another object of the present invention is to provide a charged particle beam exposure method for exposing an exposure region of a substrate which is placed on a movable stage by irradiating a charged particle beam on the exposure region of the substrate, comprising the steps of (a) dividing the exposure region into a plurality of band-shaped regions, (b) deflecting the charged particle beam within a drawing range from one side to the other side of each band-shaped region in a longitudinal direction of the band-shaped region while continuously moving the stage in a stage moving direction, where the drawing range is a range in which the charged particle beam can be deflected, (c) monitoring a deflection position of the charged particle beam on the substrate along the stage moving direction, and (d) varying a moving speed of the stage depending on an integrated value of the deflection position, where the deflection position is integrated at predetermined time intervals. According to the charged particle beam exposure method of the present invention, it is possible to always move the stage at an optimum speed so that the charged particle beam exposure can be carried out at a high speed. Further, the stage can be moved smoothly.

A further object of the present invention is to provide a charge particle beam exposure apparatus comprising a stage which is movable in a stage moving direction and has a substrate placed thereon, where the substrate has an exposure region which is divided into a plurality of band-shaped regions, driving means for driving the stage, means for irradiating a charged particle beam on the exposure region of the substrate on the stage, deflection means for deflecting the charged particle beam within a drawing range from one side to the other side of each band-shaped region in a longitudinal direction of the band-shaped region while the stage is continuously moved by the driving means, comparator means for comparing a deflection position of the charged particle beam on the substrate along the stage moving direction with one or a plurality of reference positions, and control means, coupled to the driving means and the comparator means, for controlling the driving means so that a moving speed of the stage varies depending on the deflection position relative to one or a plurality of reference positions located along the stage moving direction within the drawing range. According to the charged particle beam exposure apparatus of the present invention, it is possible to always move the stage at an optimum speed so that the charged particle beam exposure can be carried out at a high speed.

Another object of the present invention is to provide a charge particle beam exposure apparatus comprising a stage which is movable in a stage moving direction and has a substrate placed thereon, where the substrate has an exposure region which is divided into a plurality of band-shaped regions, driving means for driving the stage, means for irradiating a charged particle beam on the exposure region of the substrate on the stage, deflection means for deflecting the charged particle beam within a drawing range from one side to the other side of each band-shaped region in a longitudinal direction of the band-shaped region while the stage is continuously moved by the driving means, integration means for integrating a deflection position of the charged particle beam on the substrate along the stage moving direction at predetermined time intervals, and control means, coupled to the driving means and the integration means, for controlling the driving means so that a moving speed of the stage varies depending on the integrated value of the deflection position. According to the charged particle beam exposure apparatus of the present invention, it is possible to always move the stage at an optimum speed so that the charged particle beam exposure can be carried out at a high speed. Further, the stage can be moved smoothly.

Other objects and further features of the present invention will be apparent from the following detailed description when read in conjunction with the accompanying drawings.

DESCRIPTION OF THE PREFERRED EMBODIMENTS

Figure 1:
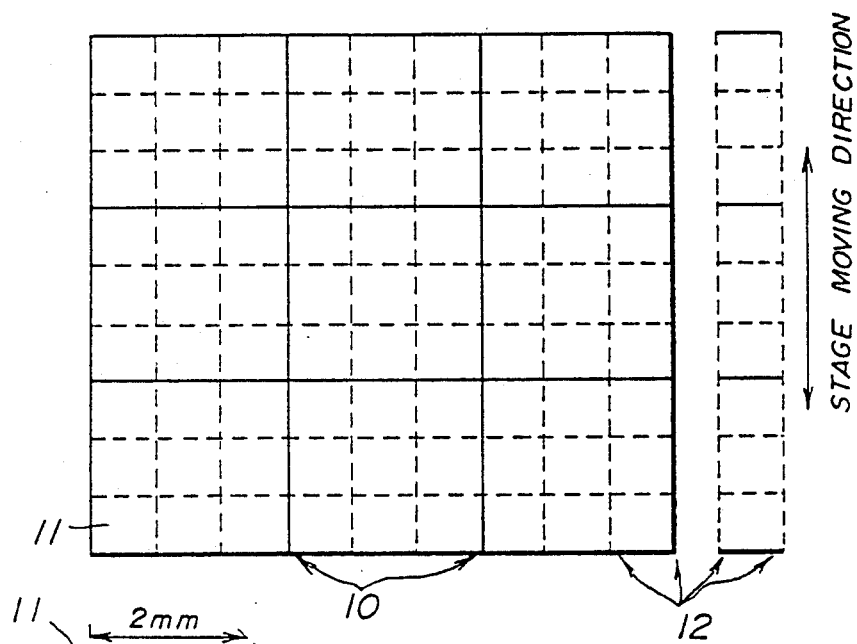
FIG. 1 is a plan view showing an example of a sample which is exposed by a charged particle beam.
Figure 1A:
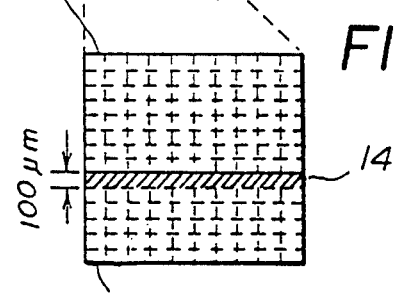
Figure 1B:
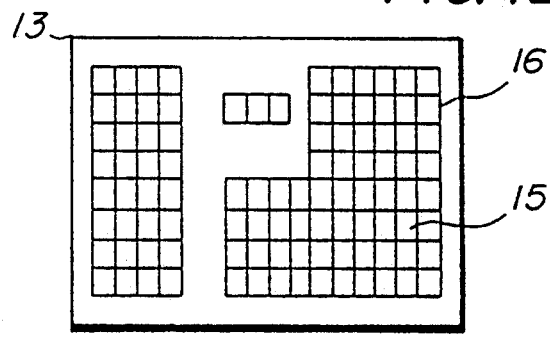
Figure 2:
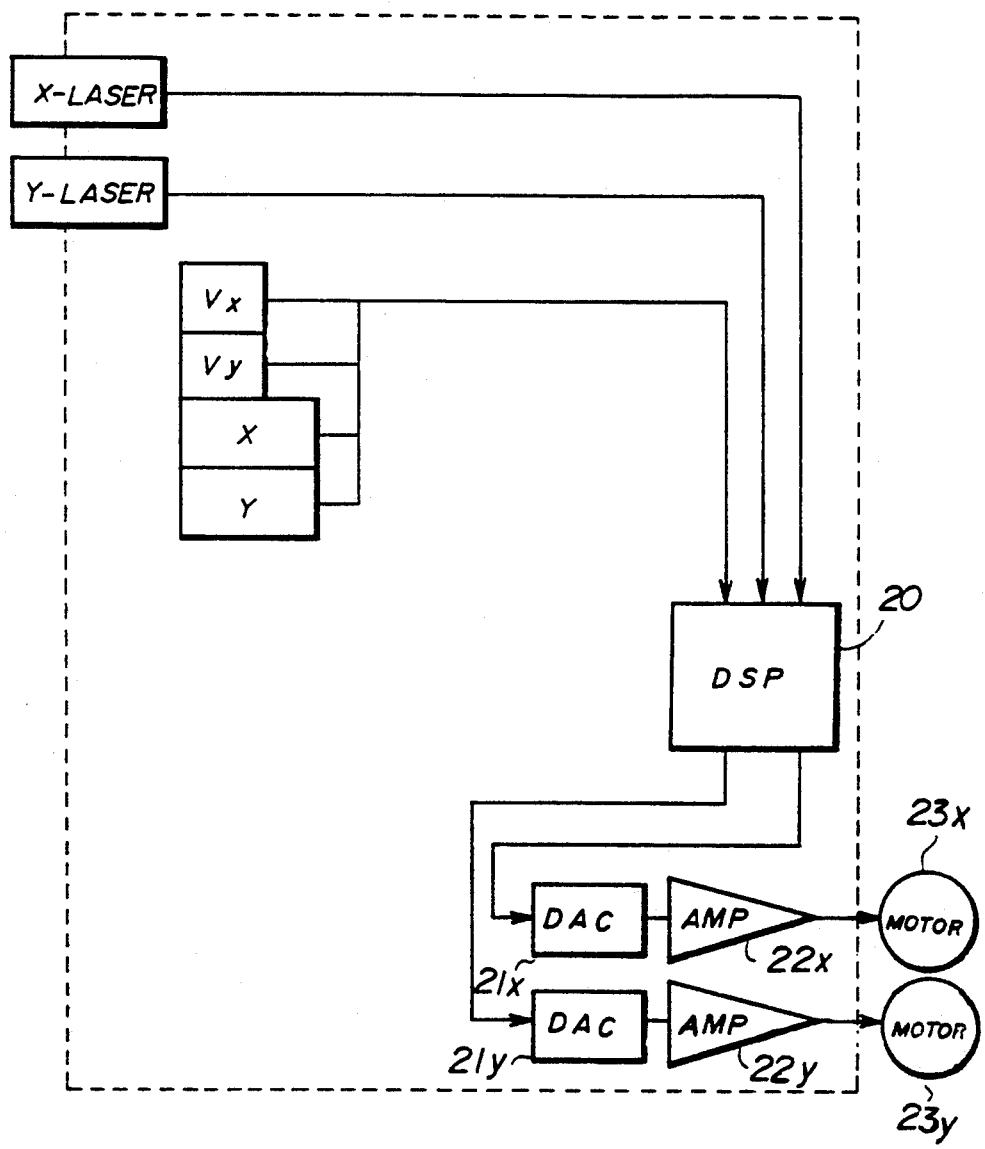
FIG. 2 is a system block diagram showing an example of a conventional stage controller.
Figure 3:
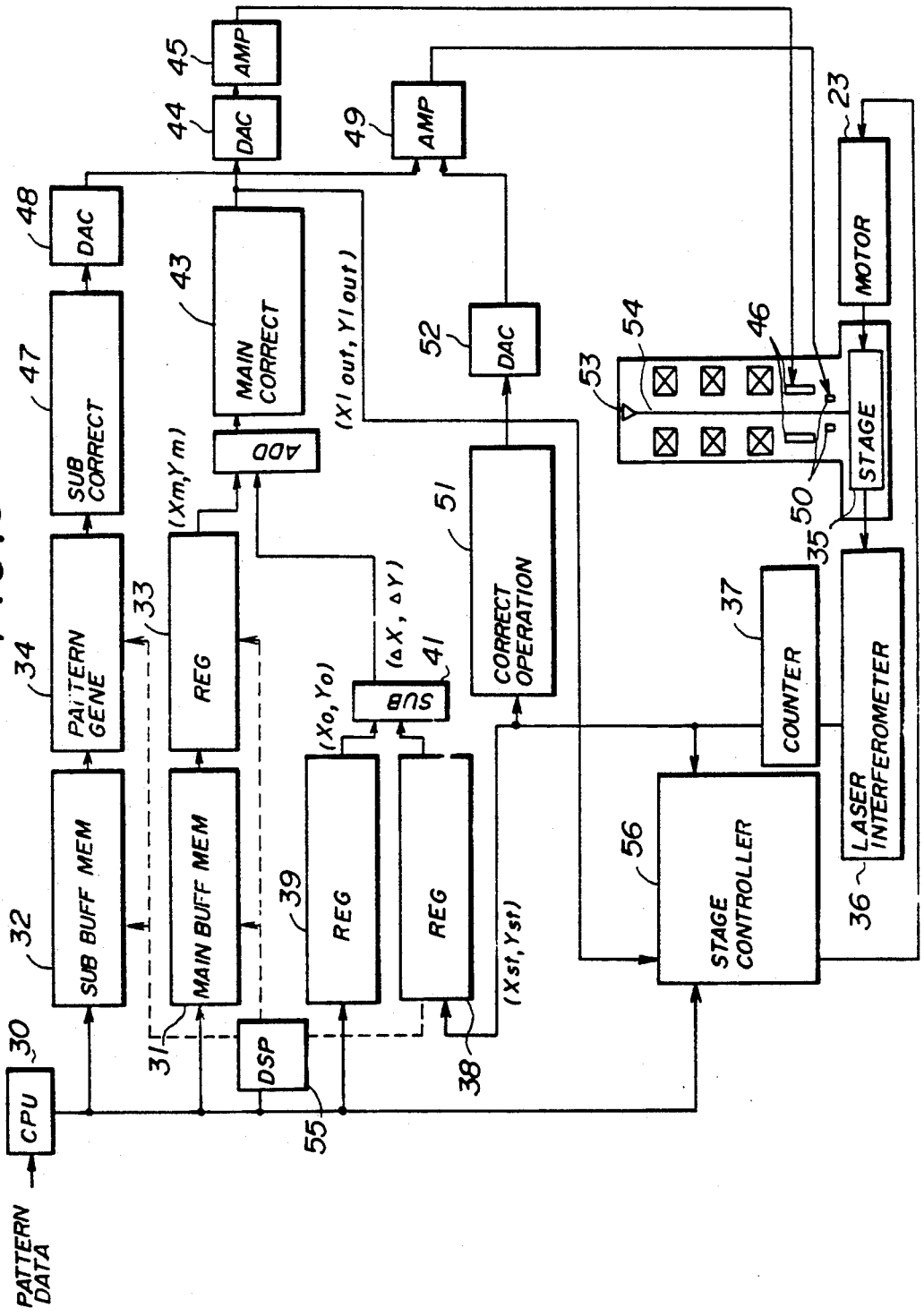
FIG. 3 is a system block diagram showing an embodiment of a charged particle beam exposure apparatus according to the present invention.
Figure 4:
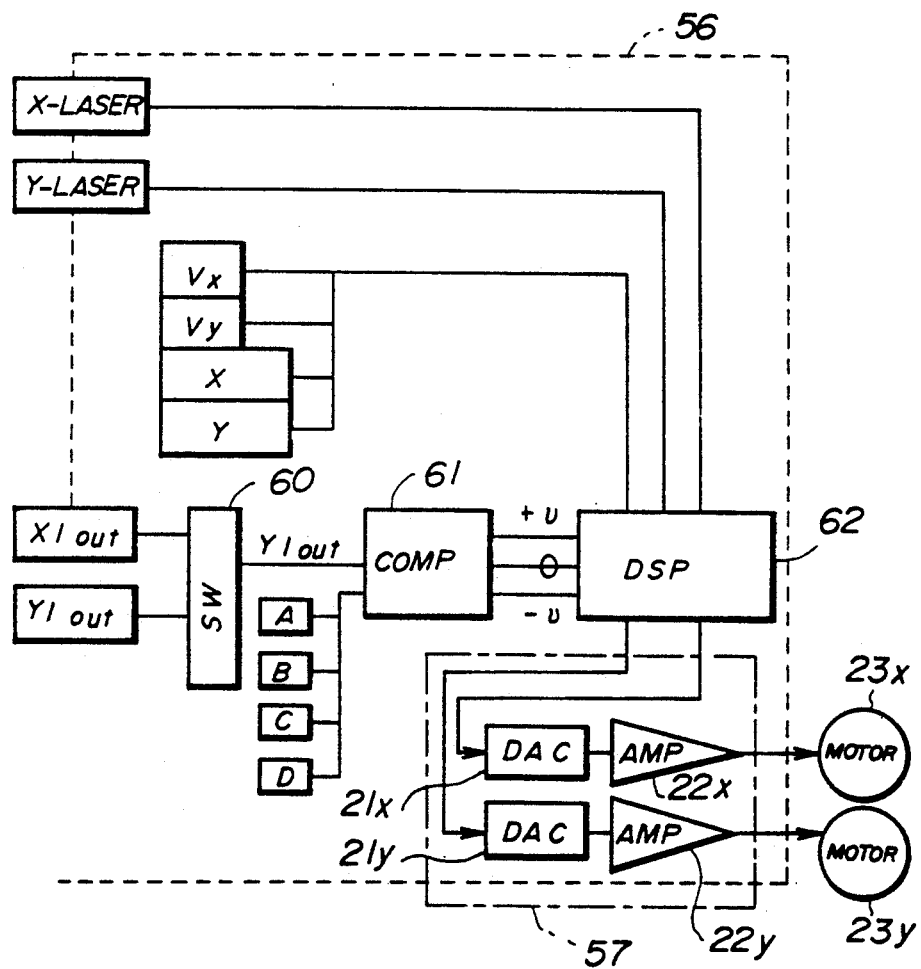
FIG. 4 is a system block diagram showing an embodiment of a stage controller of the charged particle beam exposure apparatus shown in FIG. 3.

FIG. 3 shows an embodiment of the charged particle beam exposure apparatus according to the present invention, and FIG. 4 shows an embodiment of a stage controller of the charged particle beam exposure apparatus shown in FIG. 3. In FIGS. 3 and 4, those parts which are basically the same as those corresponding parts in FIG. 2 are designated by the same reference numerals, and a description thereof will be omitted.

In FIG. 3, a central processing unit (CPU) 30 reads pattern data from a hard disk (not shown) or the like, and a position coordinate (Xm, Ym) for each sub field 15 is stored in a main buffer memory 31 as a main deflector coordinate. On the other hand, pattern data within the sub field 15 corresponding to each main deflector coordinate is stored in a sub buffer memory 32 as a sub deflector coordinate. Prior to the drawing in units of cells 11, the main deflector coordinate (Xm, Ym) is read out from the main buffer memory 31 and stored in a main deflection position register 33. The pattern data of each sub field 15 is read out from the sub buffer memory 32, but a pattern generation circuit 34 is not started at this stage.

Figure 5:
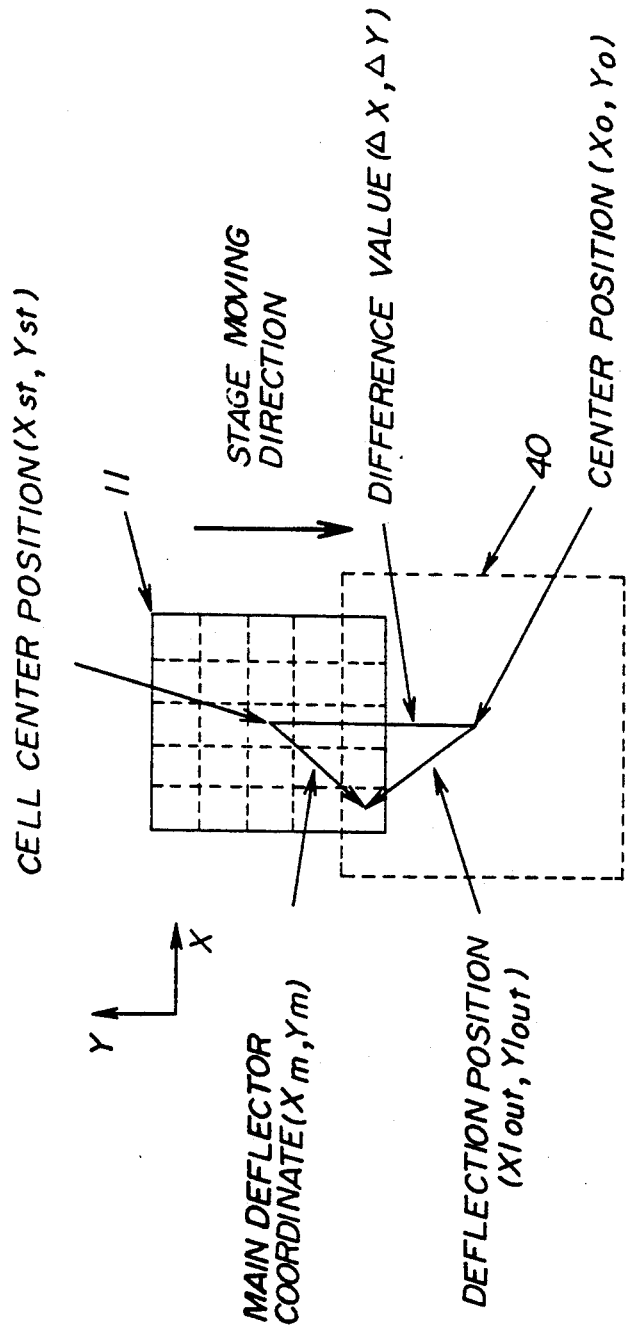
FIG. 5 is a diagram showing position coordinates of a cell and a drawing range.

At the same time as the main deflector coordinate (Xm, Ym) is stored in the main deflection position register 33, a position coordinate of a stage 35 at this instant, that is, a center position coordinate (Xst, Yst) of the cell 11 which is to be exposed, is stored in a stage position read register 38 via a laser counter 37 which is coupled to a laser interferometer 36. A position of the stage 35 where the center of the cell 11 should be located, that is, a center position (Xo, Yo) of a drawing range 40 shown in FIG. 5, is prestored in a stage target value register 39. The drawing region 40 is a region in which the electron beam can be deflected by a main deflector 46. A subtractor 41 outputs a difference value ($\Delta X$, $\Delta Y$) between the center position coordinate (Xst, Yst) of the cell 11 stored in the stage position read register 38 and the center position (Xo, Yo) of the drawing range 40 stored in the stage target value register 39. This difference value ($\Delta X$, $\Delta Y$) is added to the main deflector coordinate (Xm, Ym) in an adder 42. An added value output from the adder 42 is corrected in a main correction operation circuit 43 which determines a deflection position (Xlout, Ylout) of the main deflector 46.

The deflection position (Xlout, Ylout) is converted into an analog signal in a main deflection DAC 44, and is amplified to a main deflector driving level by a main deflection amplifier 45. An output driving signal of the main deflection amplifier 45 is supplied to the main deflector 46 which is made of an electromagnetic deflector and has a deflection range of $\pm 1000$ $\mu$m, for example. The main correction operation circuit 43 corrects the added value and outputs the deflection position (Xlout, Ylout) by correcting a rotation error of the main deflector 46 and a deflection sensitivity error of the main deflection amplifier 45. Accordingly, the setting of the deflection position (Xlout, Ylout) to the main deflection DAC 44 is made a predetermined time after the main deflector coordinate (Xm, Ym) is read out from the main buffer memory 31.

On the other hand, a sub deflector driving signal (deflection position) output from the pattern generation circuit 34 is supplied to a sub deflector 50 via a sub correction operation circuit 47, a sub deflection DAC 48 and a sub deflection amplifier 49, similarly to the supply of the main deflector driving signal (deflection position) to the main deflector 46. The sub deflector 50 is made of an electrostatic deflector having a deflection range of $\pm 50$ $\mu$m, for example. The center position coordinate (Xst, Yst) is also supplied to a stage feedback correction operation circuit 51, and a signal for correcting a position coordinate error, a rotation error of the sub deflector 50 and a deflection sensitivity error of the sub deflection amplifier 49 is supplied to the sub deflection amplifier 49 via a sub deflection DAC 52.

By supplying the deflection positions to the main deflector 46 and the sub deflector 50, an electron beam (charged particle beam) which is irradiated from an electron gun (charged particle beam irradiating part) 53 is deflected to a predetermined position. The deflection operation described above is sequentially controlled by a DSP 55.

This embodiment is characterized in that a data identical to or having upper bits (for example, 8 bits) identical to the deflection position (Xlout, Ylout) which is supplied to the main deflection DAC 44 is supplied to a stage controller 56. As shown in FIG. 4, the stage controller 56 includes a stage driver 57. This stage driver 57 includes the DACs 21x and 21y, and the amplifiers 22x and 22y, and drives the motors 23x and 23y which respectively drive the stage 35 along the X-axis and the Y-axis.

Figure 6:
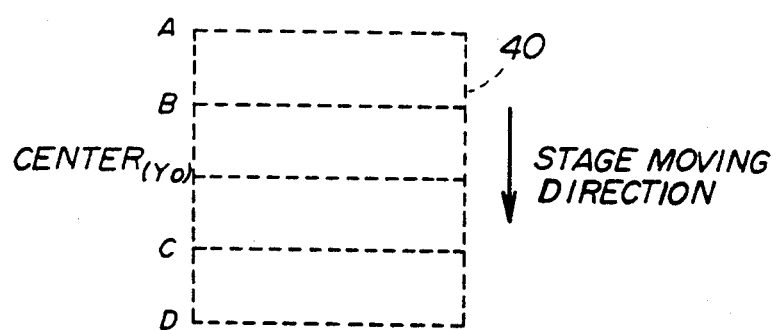
FIG. 6 is a diagram showing reference positions in the drawing range.

In the stage controller 56 shown in FIG. 4, a switch 60 supplies to a comparator circuit 61 only the deflection position data (hereinafter simply referred to as a position) Ylout along the stage moving direction out of the input deflection position (Xlout, Ylout). The comparator circuit 61 compares this position Ylout and a reference position along the stage moving direction in the drawing range 40. Positions A, B, C and D, a center position Yo of the drawing range 40 shown in FIG. 6 and the like may be used as the reference position. A DSP 62 changes the moving speed of the stage 35 based on a result of the comparison output from the comparator circuit 61. If the position Ylout is located more than a predetermined distance from the reference position (for example, the center position Yo) of the drawing range 40 on an upstream side along the stage moving direction, the DSP 62 increases the moving speed of the stage 35. On the other hand, the DSP 62 decreases the moving speed of the stage 35 if the position Ylout is located more than a predetermined distance from the reference position (for example, the center position Yo) of the drawing range 40 on a downstream side along the stage moving direction.

Figure 7:
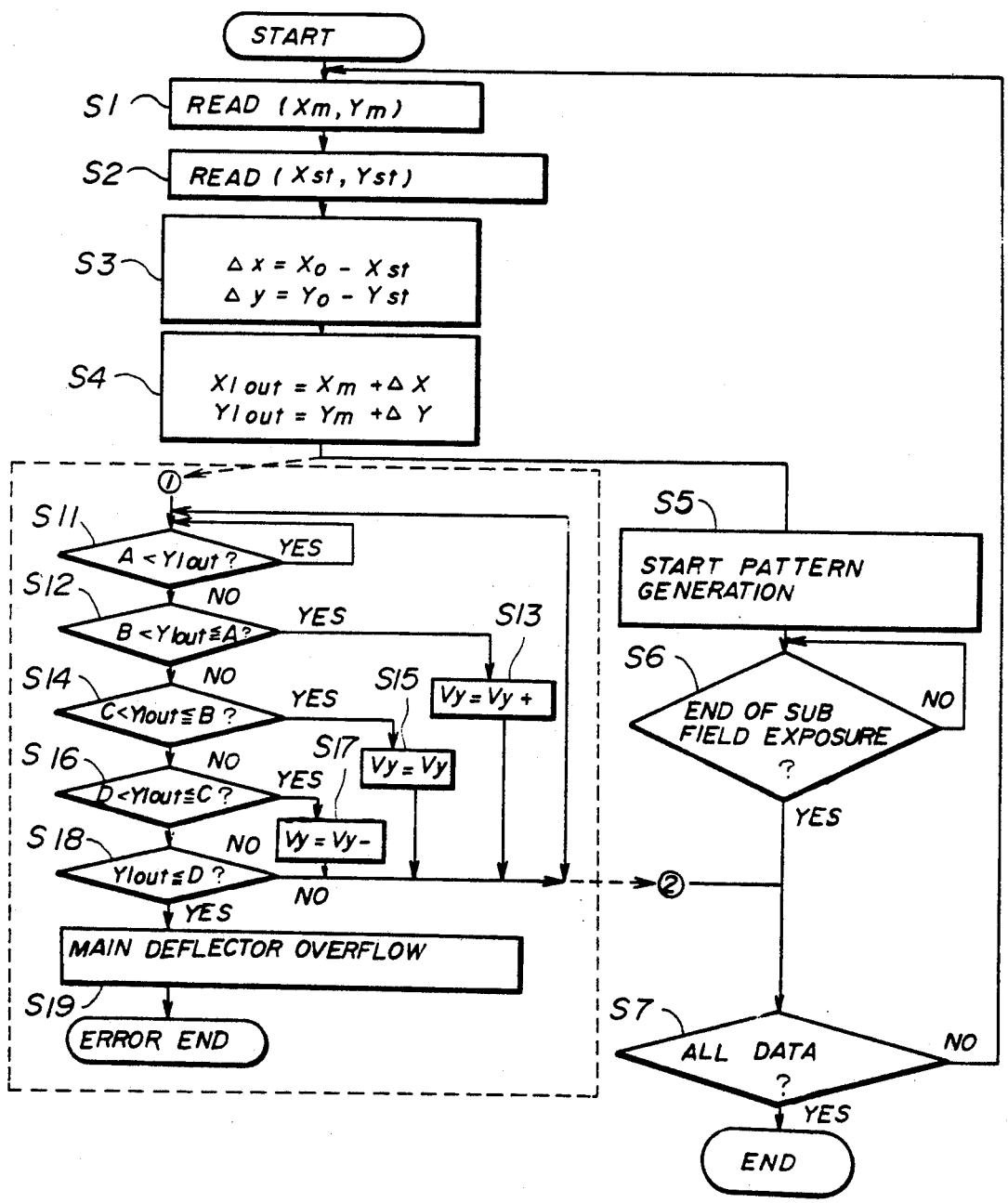
FIG. 7 is a flow chart for explaining the operation of the embodiment of the charged particle beam exposure apparatus.

Next, a description will be given of the operation of this embodiment for a case where the position B is used as an upstream side reference position and the position C is used as a downstream side reference position in the drawing range 40, by referring to the flow chart shown in FIG. 7. It is assumed for the sake of convenience that the drawing is made by moving the stage 35 in a $-Y$ direction.

First, a pattern data read instruction is output from the DSP 55 in a step S1, and the main deflector coordinate (Xm, Ym) is read into the main buffer memory 31. Then, a stage position read pulse is output from the DSP 55 in a step S2, and the present position of the stage 35, that is, the cell center position (Xst, Yst) shown in FIG. 5, is read into the stage position read register 38. The subtractor 41 calculates the difference value ($\Delta X$, $\Delta Y$) between the cell center position (Xst, Yst) and the center position (Xo, Yo) of the drawing range 40 in a step S3. Further, the adder 42 adds the main deflector coordinate (Xm, Ym) and the difference value ($\Delta X$, $\Delta Y$) in a step S4, and outputs the deflection position (Xlout, Ylout) of the main deflector 46.

Within the sub field corresponding to this deflection position (Xlout, Ylout), the DSP 55 instructs the pattern generation circuit 34 to generate the deflection pattern in a step S5, and the sub deflector 50 starts the deflection operation based on the deflection pattern, that is, the exposure process is started. The DSP 55 waits for the exposure within one sub field to end in a step S6. In other words, the step S6 decides whether or not the exposure within one sub field has ended. When the decision result in the step S6 becomes YES, the DSP 55 decides in a step S7 whether or not the exposure of all of the data (one cell) of the main deflector coordinate has ended. The process ends if the decision result in the step S7 is YES, but the process returns to the step S1 to read the next main deflection data if the decision result in the step S7 is NO.

On the other hand, the deflection position (Xlout, Ylout) of the main deflector 46 calculated in the step S4 is also supplied to the stage controller 56. The DSP 62 of the stage controller 56 carries out steps S11 through S19 which are surrounded by a dotted line in FIG. 7. The DSP 62 instructs the comparator circuit 61 to compare the deflection position Ylout of the main deflector 46 along the stage moving direction with the reference positions A through D, and varies the moving speed of the stage 35 in the following manner.

A step S11 decides whether or not $A<Ylout$. If the decision result in the step S11 is YES, the stage 35 has not reached the drawing range 40. Hence, the stage 35 is moved in a state where the exposure is stopped until the cell 11 falls within the drawing range 40. On the other hand, the exposure process is started if the decision result in the step S11 is NO, and the process advances to a step S12.

The step S12 decides whether or not $B<Ylout \leq A$. If the decision result in the step S12 is YES, a step S13 increases a moving speed Vy of the stage 35 in the stage moving direction by a predetermined speed v. On the other hand, the process advances to a step S14 if the decision result in the step S12 is NO.

The step S14 decides whether or not $C<Ylout \leq B$. If the decision result in the step S14 is YES, a step S15 does not vary the moving speed Vy of the stage 35 and the stage 35 is moved in the stage moving direction at the constant moving speed Vy. On the other hand, the process advances to a step S16 if the decision result in the step S14 is NO.

The step S16 decides whether or not $D<Ylout \leq C$. If the decision result in the step S16 is YES, a step S17 decreases the moving speed Vy of the stage 35 in the stage moving direction by the predetermined speed v. On the other hand, the process advances to a step S18 if the decision result in the step S16 is NO.

The step S18 decides whether or not $Ylout \leq D$. The process returns to the step S11 if the decision result in the step S18 is NO. But if the decision result in the step S18 is YES, this means that the deflection position Ylout has exceeded the drawing region 40 and it is necessary to stop the exposure. Hence, when the abnormal state occurs and the decision result in the step S18 is YES, a step S19 detects the main deflection overflow and the process ends.

Next, a description will be given of the continuous movement of the stage 35, by referring to FIGS. 8 through 17. It is assumed for the sake of convenience that the cell 11 moves from the top to bottom in FIGS. 8 through 17 along the direction Y when the stage 35 moves as described above.

Figure 8:
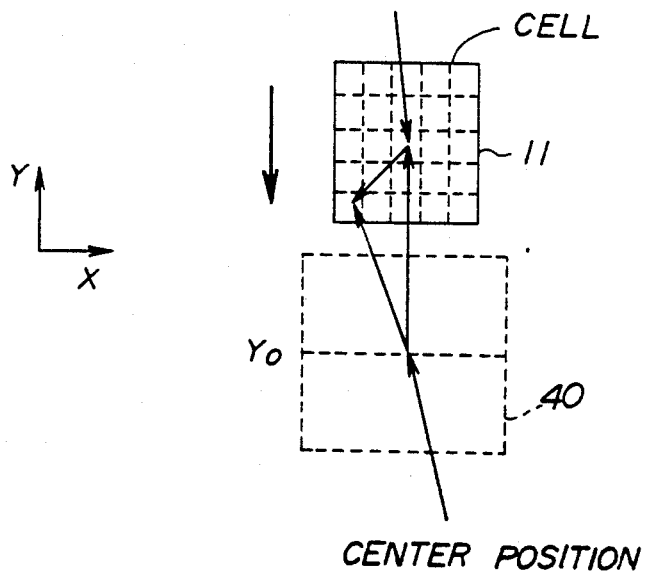
FIGS. 8 through 17 are diagrams respectively showing positional relationships of the cell and the drawing range when continuously moving a stage.
Figure 9:
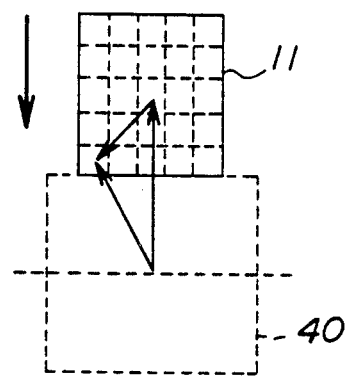

In FIGS. 8 and 9, the cell 11 has not yet entered the drawing range 40, and the pattern is not exposed.

Figure 10:
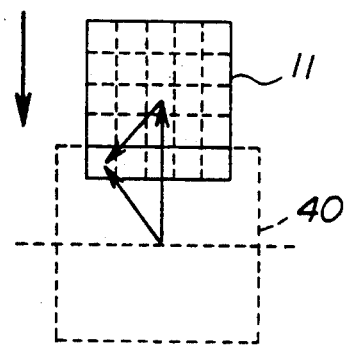
Figure 11:
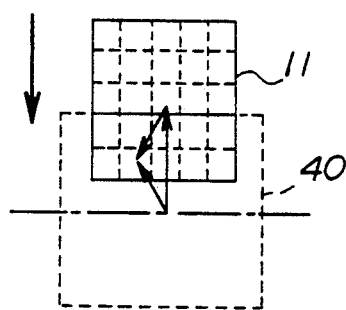
Figure 12:
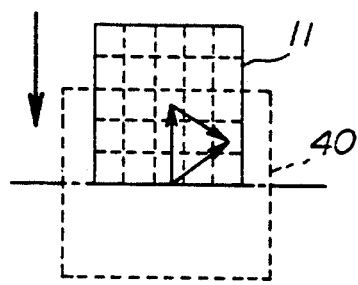
Figure 13:
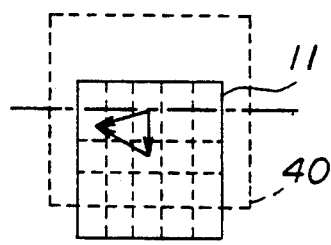
Figure 14:
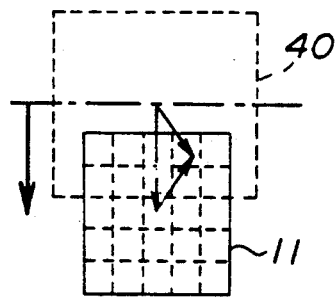
Figure 15:
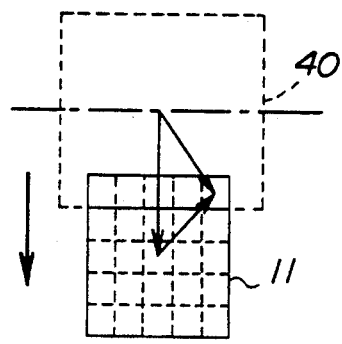

In FIG. 10, the deflection position Ylout enters the drawing range 40, and the exposure is started for the first time. The exposure is successively carried out thereafter as shown in FIGS. 11 through 15.

Figure 16:
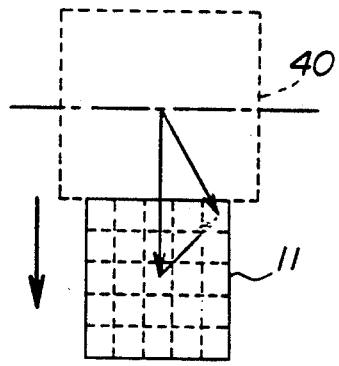
Figure 17:
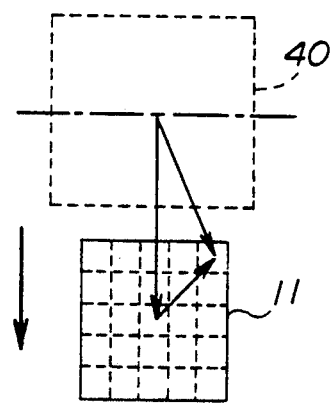

In the cases shown in FIGS. 16 and 17, the deflection position Ylout has exceeded the drawing range 40 and the stage 35 is moving in a direction away from the drawing range 40. Hence, the main deflection overflow occurs and the error is detected as described above in conjunction with the step S19 shown in FIG. 7.

In this embodiment, the comparator circuit 61 compares the deflection position Ylout of the main deflector 46 and the reference positions A through D of the drawing range 40. If the deflection position Ylout is located on the upstream side with respect to the reference position B as a result of the comparison, the DSP 62 increases the moving speed of the stage 35. On the other hand, if the deflection position Ylout is located on the downstream side of the reference position C as a result of the comparison, the DSP 62 decreases the moving speed of the stage 35. For this reason, the deflection position Ylout concentrates in a vicinity (C<B) of the center position Yo of the drawing range 40, and the cell 11 will not exceed the drawing range 40 in the unexposed state as shown in FIGS. 16 and 17. Therefore, the speed control of the stage 35 can be carried out real-time in correspondence with the total exposure time of the cell 11, and the stage 35 can always be moved at the appropriate moving speed. Consequently, the loss time of the exposure process is minimized, and the charged particle beam exposure can be carried out at a high speed.

In addition, it is also possible in this embodiment to compare the deflection position Ylout of the main deflector 46 and the center position Yo of the drawing range 40 and increase the moving speed of the stage 35 if the deflection position Ylout is located on the upstream side of the center position Yo and to decrease the moving speed of the stage 35 if the deflection position Ylout is located on the downstream side of the center position Yo. In this case, it is also possible to obtain the same effects described above.

According to this embodiment, the reference position is set, and the moving speed of the stage 35 is varied depending on the relative position of the deflection position Ylout with respect to the reference position. However, it is also possible to vary the moving speed of the stage 35 depending on a distance between the deflection position Ylout and the reference position A or D, for example.

Figure 18:
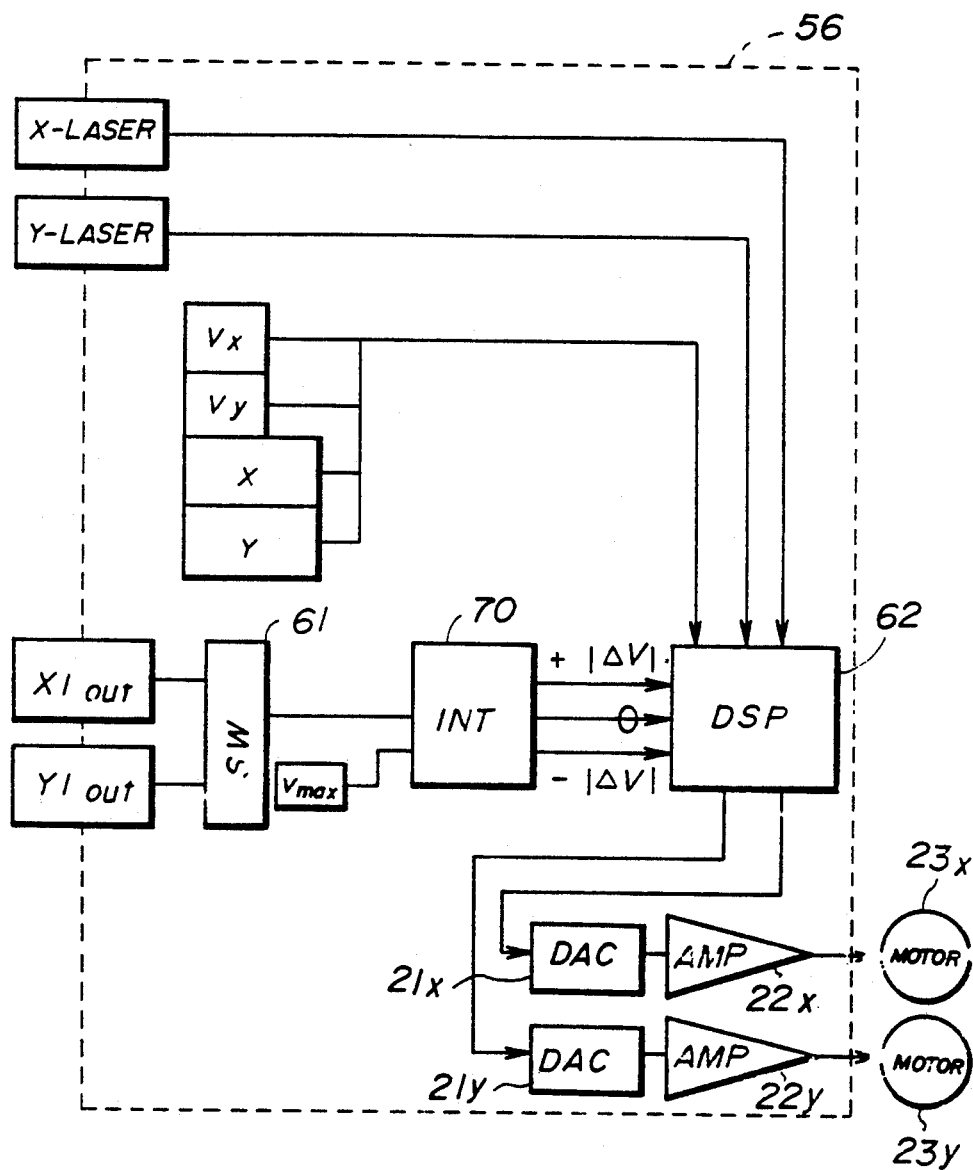
FIG. 18 is a system block diagram showing another embodiment of the stage controller.

FIG. 18 shows another embodiment of the stage controller 56. In the above described embodiment, the deflection position Ylout is compared with the reference positions A through D. But in this embodiment, the moving speed of the stage 35 is varied depending on an integrated value of the deflection position Ylout for every predetermined time interval of 1 ms, for example. In other words, the deflection position Ylout of the main deflector 46 in the stage moving direction is integrated in an integrating circuit 70 show in FIG. 18 according to the following formula, where $\alpha$ and $\beta$ denote constants. Then, the DSP 62 varies the moving speed of the stage 35 based on the integrated value $\Delta V$.

$$\Delta V = \alpha \cdot [\int (Ylout) dt] + \beta$$

An upper limit is provided with respect to the amount the moving speed of the stage 35 may be varied, by setting $|\Delta V| < Vmax$. As a result, the change in speed (acceleration) becomes small, and it becomes possible to gradually vary the moving speed of the stage 35. Hence, it is possible to prevent irregular movement of the stage 35 and enable the exposure process to be carried out smoothly.

According to this embodiment, it is possible to obtain the same effects obtained in the above described embodiment. In addition, it is possible to control the moving speed of the stage 35 within the entire drawing region 40 and ensure smooth movement of the stage 35.

As described above, the deflection position Ylout of the charged particle beam along the stage moving direction is monitored, and the moving speed of the stage 35 is varied depending on the deflection position Ylout. Therefore, the moving speed of the stage 35 can be set in real-time to an optimum moving speed.

The electron beam is used as the charged particle beam in the described embodiment, but it is of course possible to use an ion beam, for example.

The initial moving speed of the stage 35 when the deflection position Ylout is outside the drawing region 40 may be set according to a conventional method, such as the conventional methods described in the introductory part of this specification. In the latter case, after the (initial) moving speed of the stage 35 is once set to a suitable speed, the present invention successively varies this moving speed of the stage 35 depending on the deflection position Ylout so as to carry out the exposure at a further improved speed.

Further, the present invention is not limited to these embodiments, but various variations and modifications may be made without departing from the scope of the present invention.

What is claimed is:

1. A charged particle beam exposure method for exposing an exposure region of a substrate which is placed on a movable stage by irradiating a charged particle beam on the exposure region of the substrate, said charged particle beam exposure method comprising the steps of:
    (a) dividing the exposure region into a plurality of band-shaped regions;
    (b) deflecting the charged particle beam within a drawing range from one side to the other side of each band-shaped region in a longitudinal direction of the band-shaped region while continuously moving the stage in a stage moving direction, said drawing range being a range in which the charged particle beam can be deflected;
    (c) monitoring a deflection position of the charged particle beam on the substrate along the stage moving direction; and
    (d) varying a moving speed of the stage depending on the deflection position relative to one or a plurality of reference positions located along the stage moving direction within the drawing range.

2. The charged particle beam exposure method as claimed in claim 1, wherein said step (d) uses a center position of the drawing range along the stage moving direction as the reference position.

3. The charged particle beam exposure method as claimed in claim 2, wherein said step (d) increases the moving speed of the stage in the stage moving direction if the deflection position is located on an upstream side of the reference position along the stage moving direction and decreases the moving speed of the stage in the stage moving direction if the deflection position is located on a downstream side of the reference position along the stage moving direction.

4. The charged particle beam exposure method as claimed in claim 1, wherein said step (d) uses as the reference positions a first reference position which is located on an upstream side of a center position of the drawing range along the stage moving direction, and a second reference position which is located on a downstream side of the center position of the drawing range along the stage moving direction.

5. The charged particle beam exposure method as claimed in claim 4, wherein said step (d) increases the moving speed of the stage in the stage moving direction if the deflection position is located on the upstream side of the first reference position along the stage moving direction and decreases the moving speed of the stage in the stage moving direction if the deflection position is located on the downstream side of the second reference position along the stage moving direction.

6. The charged particle beam exposure method as claimed in claim 5, wherein said step (d) keeps the moving speed of the stage constant if the deflection position is located on the downstream side of the first reference position along the stage moving direction and on the upstream side of the second reference position along the stage moving direction.

7. The charged particle beam exposure method as claimed in claim 1, wherein said step (d) varies the moving speed of the stage in real-time.

8. A charged particle beam exposure method for exposing an exposure region of a substrate which is placed on a movable stage by irradiating a charged particle beam on the exposure region of the substrate, said charged particle beam exposure method comprising the steps of:
   (a) dividing the exposure region into a plurality of band-shaped regions;
   (b) deflecting the charged particle beam within a drawing range from one side to the other side of each band-shaped region in a longitudinal direction of the band-shaped region while continuously moving the stage in a stage moving direction, said drawing range being a range in which the charged particle beam can be deflected;
   (c) monitoring a deflection position of the charged particle beam on the substrate along the stage moving direction; and
   (d) varying a moving speed of the stage depending on an integrated value of the deflection position, said deflection position being integrated at predetermined time intervals.

9. The charged particle beam exposure method as claimed in claim 8, wherein said step (d) sets an upper limit to an amount by which the moving speed of the stage is varied.

10. The charged particle beam exposure method as claimed in claim 8, wherein said step (d) varies the moving speed of the stage in real-time.

11. A charge particle beam exposure apparatus comprising:
   a stage which is movable in a stage moving direction and has a substrate placed thereon, said substrate having an exposure region which is divided into a plurality of band-shaped regions;
   driving means for driving the stage;
   means for irradiating a charged particle beam on the exposure region of the substrate on the stage;
   deflection means for deflecting the charged particle beam within a drawing range from one side to the other side of each band-shaped region in a longitudinal direction of the band-shaped region while the stage is continuously moved by the driving means;
   comparator means for comparing a deflection position of the charged particle beam on the substrate along the stage moving direction with one or a plurality of reference positions; and
   control means, coupled to the driving means and the comparator means, for controlling the driving means so that a moving speed of the stage varies depending on the deflection position relative to one or a plurality of reference positions located along the stage moving direction within the drawing range.

12. The charged particle beam exposure apparatus as claimed in claim 11, wherein a center position of the drawing range along the stage moving direction is used as the reference position.

13. The charged particle beam exposure apparatus as claimed in claim 12, wherein said control means controls the driving means to increase the moving speed of the stage in the stage moving direction if the deflection position is located on an upstream side of the reference position along the stage moving direction and to decease the moving speed of the stage in the stage moving direction if the deflection position is located on a downstream side of the reference position along the stage moving direction.

14. The charged particle beam exposure apparatus as claimed in claim 11, wherein a first reference position which is located on an upstream side of a center position of the drawing range along the stage moving direction, and a second reference position which is located on a downstream side of the center position of the drawing range along the stage moving direction are used as the reference positions.

15. The charged particle beam exposure apparatus as claimed in claim 14, wherein said control means controls the driving means to increase the moving speed of the stage in the stage moving direction if the deflection position is located on the upstream side of the first reference position along the stage moving direction and to decrease the moving speed of the stage in the stage moving direction if the deflection position is located on the downstream side of the second reference position along the stage moving direction.

16. The charged particle beam exposure apparatus as claimed in claim 15, wherein said control means controls the driving means to keep the moving speed of the stage constant if the deflection position is located on the downstream side of the first reference position along the stage moving direction and on the upstream side of the second reference position along the stage moving direction.

17. The charged particle beam exposure apparatus as claimed in claim 11, wherein said control means controls the driving means to vary the moving speed of the stage in real-time.

18. A charge particle beam exposure apparatus comprising:
   a stage which is movable in a stage moving direction and has a substrate placed thereon, said substrate having an exposure region which is divided into a plurality of band-shaped regions;
   driving means for driving the stage;
   means for irradiating a charged particle beam on the exposure region of the substrate on the stage;
   deflection means for deflecting the charged particle beam within a drawing range from one side to the other side of each band-shaped region in a longitudinal direction of the band-shaped region while the stage is continuously moved by the driving means;
   integration means for integrating a deflection position of the charged particle beam on the substrate along the stage moving direction at predetermined time intervals; and
   control means, coupled to the driving means and the integration means, for controlling the driving means so that a moving speed of the stage varies depending on the integrated value of the deflection position.

19. The charged particle beam exposure apparatus as claimed in claim 18, wherein said control means sets an upper limit to an amount by which the moving speed of the stage is varied.

20. The charged particle beam exposure apparatus as claimed in claim 18, wherein said control means controls the driving means to vary the moving speed of the stage in real-time.

* * * * *

UNITED STATES PATENT AND TRADEMARK OFFICE
CERTIFICATE OF CORRECTION

PATENT NO. : 5,180,920
DATED : Jan. 19, 1993
INVENTOR(S) : KAI et al.

It is certified that error appears in the above-indentified patent and that said Letters Patent is hereby corrected as shown below:

* Col. 4, line 31, change "charge" to --charged--.

Col. 6, line 19, change "(Xlout, Ylout)" to --(X1out, Y1out)--;
line 20, change "(Xlout, Ylout)" to --(X1out, Y1out)--;
line 29, change "(Xlout, Ylout)" to --(X1out, Y1out)--;
line 32, change "(Xlout, Ylout)" to --(X1out, Y1out)--;
line 61, change "(Xlout, Ylout)" to --(X1out, Y1out)--.

Col. 7, line 4, change "Ylout" to --Y1out--;
line 5, change "(Xlout, Ylout)" to --(X1out, Y1out)--;
line 6, change "Ylout" to --Y1out--;
line 13, change "Ylout" to --Y1out--;
line 19, change "Ylout" to --Y1out--;
line 47, change "(Xlout, Ylout)" to --(X1out, Y1out)--;
line 62, change "(Xlout," to --(X1out,--;
line 63, change "Ylout)" to --Y1out)--;
line 68, change "Ylout" to --Y1out--.

Col. 8, line 4, change "Ylout" to --Y1out--;
line 12, change "Ylout" to --Y1out--;
line 18, change "Ylout" to --Y1out--;
line 25, change "Ylout" to --Y1out--;
line 31, change "Ylout" to --Y1out--;
line 48, change "Ylout" to --Y1out--;
line 59, change "Ylout" to --Y1out--;
line 61, change "Ylout" to --Y1out--;
line 65, change "Ylout" to --Y1out--.

UNITED STATES PATENT AND TRADEMARK OFFICE
CERTIFICATE OF CORRECTION

PATENT NO. : 5,180,920
DATED : Jan. 19, 1993
INVENTOR(S) : KAI et al.

It is certified that error appears in the above-indentified patent and that said Letters Patent is hereby corrected as shown below:

Col. 9,  line 1, change "Ylout" to --Y1out--;
 line 16, change "Ylout" to --Y1out--;
 line 18, change "Ylout" to --Y1out--;
 line 24, change "Ylout" to --Y1out--;
 line 27, change "Ylout" to --Y1out--;
 line 32, change "Ylout" to --Y1out--;
 line 34, change "Ylout" to --Y1out--;
 line 36, change "Ylout" to --Y1out--;
 line 43, in the equation, change "(Ylout)" to --(Y1out)--;
 line 58, change "Ylout" to --Y1out--;
 line 61, change "Ylout" to --Y1out--;
 line 68, change "Ylout" to --Y1out--.

Col. 10, line 7, change "Ylout" to --Y1out--.

* Col. 12, line 37, change "charge" to --charged--.
Col. 7, line 45, change "(Xlout, Ylout)" to --(Xlout, Ylout)--.
Col. 8, lines 35 and 53, change "Ylout" to --Ylout--.
Col. 9, line 13, change "Ylout" to --Ylout--.

Signed and Sealed this

Ninth Day of August, 1994

Attest:

BRUCE LEHMAN

*Attesting Officer*      *Commissioner of Patents and Trademarks*